United States Patent
Li et al.

(10) Patent No.: US 11,605,553 B2
(45) Date of Patent: Mar. 14, 2023

(54) METHOD AND APPARATUS FOR UNPACKING SEMICONDUCTOR WAFER CONTAINER

(71) Applicant: TAIWAN SEMICONDUCTOR MANUFACTURING CO., LTD., Hsinchu (TW)

(72) Inventors: Fu-Hsien Li, Taichung (TW); Chi-Feng Tung, Jhunan Township (TW); Chi Yuan Chu, Taichung (TW); Jen-Ti Wang, Taichung (TW); Hsiang Yin Shen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 296 days.

(21) Appl. No.: 17/099,734

(22) Filed: Nov. 16, 2020

(65) Prior Publication Data

US 2021/0082736 A1    Mar. 18, 2021

Related U.S. Application Data

(62) Division of application No. 15/339,343, filed on Oct. 31, 2016, now Pat. No. 10,840,121.

(51) Int. Cl.
*B65B 69/00*     (2006.01)
*H01L 21/67*     (2006.01)
*H01L 21/683*    (2006.01)

(52) U.S. Cl.
CPC ...... *H01L 21/6838* (2013.01); *B65B 69/0008* (2013.01); *H01L 21/67196* (2013.01)

(58) Field of Classification Search
CPC .......... H01L 21/6838; H01L 21/67196; B65B 69/0008
See application file for complete search history.

(56) References Cited

U.S. PATENT DOCUMENTS

| | | | |
|---|---|---|---|
| 3,327,115 A | 6/1967 | Bartlett | |
| 4,091,919 A * | 5/1978 | MacLeod | H01L 21/67386 206/524.8 |
| 4,724,874 A | 2/1988 | Parikh et al. | |
| 4,856,904 A | 8/1989 | Akagawa | |

(Continued)

FOREIGN PATENT DOCUMENTS

| | | | | |
|---|---|---|---|---|
| DE | 10048374 A1 * | 4/2001 | ............. | C30B 33/06 |
| FR | 2738800 A1 * | 3/1997 | ......... | B65B 69/0008 |

(Continued)

OTHER PUBLICATIONS

Non-Final Office Action issued in U.S. Appl. No. 15/339,343, dated Sep. 16, 2019.

(Continued)

*Primary Examiner* — Nathaniel C Chukwurah
*Assistant Examiner* — Lucas E. A. Palmer
(74) *Attorney, Agent, or Firm* — McDermott Will & Emery LLP

(57) ABSTRACT

An automated method of unpacking a container containing semiconductor wafers from a sealed bag is provided. The method includes inflating the bag with a gas using an automated gas dispenser. After inflating the bag, the bag is cut using an automated cutting device to expose the container, and the cut bag is removed from around the container.

20 Claims, 14 Drawing Sheets

(56) References Cited

U.S. PATENT DOCUMENTS

| | | |
|---|---|---|
| 5,105,147 A | 4/1992 | Karasikov et al. |
| 5,613,824 A * | 3/1997 | Kato .................. B65B 69/0033 |
| | | 141/330 |
| 5,649,338 A | 7/1997 | Kato |
| 5,649,801 A | 7/1997 | White |
| 5,806,574 A | 9/1998 | Yamashita et al. |
| 6,048,154 A | 4/2000 | Wytman |
| 6,395,240 B1 | 5/2002 | Fujii et al. |
| 6,420,864 B1 | 7/2002 | Abraham et al. |
| 7,077,173 B2 | 7/2006 | Tokunaga |
| 8,186,927 B2 | 5/2012 | Okabe et al. |
| 8,596,312 B2 | 12/2013 | Natsume et al. |
| 9,524,893 B2 | 12/2016 | Takahara et al. |
| 9,543,179 B2 | 1/2017 | Jhon et al. |
| 2002/0009592 A1 | 1/2002 | Kitano et al. |
| 2005/0109851 A1 | 5/2005 | Fujimori |
| 2005/0194279 A1 | 9/2005 | Coppola et al. |
| 2005/0274430 A1 | 12/2005 | Yokoi et al. |
| 2007/0209591 A1 | 9/2007 | Nagaike et al. |
| 2007/0229789 A1 | 10/2007 | Kawamura |
| 2007/0286598 A1 | 12/2007 | Yoshino |
| 2007/0286712 A1 | 12/2007 | Rebstock |
| 2008/0076233 A1 * | 3/2008 | Morishige ........... H01L 21/6715 |
| | | 257/E21.599 |
| 2008/0239291 A1 | 10/2008 | Miyanohara et al. |
| 2008/0260498 A1 | 10/2008 | Nagata et al. |
| 2009/0035100 A1 | 2/2009 | Okabe et al. |
| 2009/0087285 A1 | 4/2009 | Mitsuyoshi |
| 2009/0304463 A1 | 12/2009 | Dance et al. |
| 2010/0040441 A1 | 2/2010 | Obikane |
| 2010/0065467 A1 | 3/2010 | Murata |
| 2010/0143082 A1 | 6/2010 | Wang et al. |
| 2010/0175781 A1 | 7/2010 | Kisakibaru et al. |
| 2010/0298966 A1 | 11/2010 | Tanaka |
| 2012/0061565 A1 | 3/2012 | Enyama et al. |
| 2012/0090280 A1 | 4/2012 | Anatrini |
| 2012/0109364 A1 | 5/2012 | Harada et al. |
| 2012/0181215 A1 * | 7/2012 | Brooks ............. H01L 21/67369 |
| | | 206/711 |
| 2012/0258570 A1 * | 10/2012 | Shirakawa ........ H01L 21/67745 |
| | | 118/712 |
| 2012/0298549 A1 | 11/2012 | Fujimori et al. |
| 2013/0004268 A1 | 1/2013 | Rebstock |
| 2013/0230375 A1 | 9/2013 | Tung et al. |
| 2013/0240398 A1 | 9/2013 | Garner et al. |
| 2014/0014225 A1 | 1/2014 | Takahara et al. |
| 2014/0086720 A1 | 3/2014 | Kao et al. |
| 2015/0053138 A1 | 2/2015 | Ramsey et al. |
| 2015/0083638 A1 | 3/2015 | Corbin |
| 2015/0314903 A1 | 11/2015 | Aya et al. |
| 2016/0016693 A1 | 1/2016 | Yoshikane et al. |
| 2017/0010323 A1 | 1/2017 | Ishimoto et al. |
| 2017/0099803 A1 * | 4/2017 | Neighbors ............ A01K 29/005 |
| 2017/0287783 A1 * | 10/2017 | Shimanuki .......... H01L 21/6838 |
| 2018/0275192 A1 | 9/2018 | Yamada |
| 2018/0299487 A1 | 10/2018 | Yamada |
| 2020/0172280 A1 * | 6/2020 | Franke ................ B65B 69/0008 |

FOREIGN PATENT DOCUMENTS

| | | | | |
|---|---|---|---|---|
| JP | 2000183126 A | * | 6/2000 | |
| JP | 2000281172 A | * | 10/2000 | |
| WO | WO-2004019387 A1 | * | 3/2004 | ....... H01L 21/67778 |
| WO | WO-2009135543 A1 | * | 11/2009 | ............. B65G 1/127 |
| WO | 2013017315 A2 | | 2/2013 | |
| WO | WO-2013017315 A2 | * | 2/2013 | ......... B65B 69/0008 |

OTHER PUBLICATIONS

Final Office Action issued in U.S. Appl. No. 15/339,343, dated Mar. 30, 2020.

Notice of Allowance issued in U.S. Appl. No. 15/339,343, dated Jul. 9, 2020.

* cited by examiner

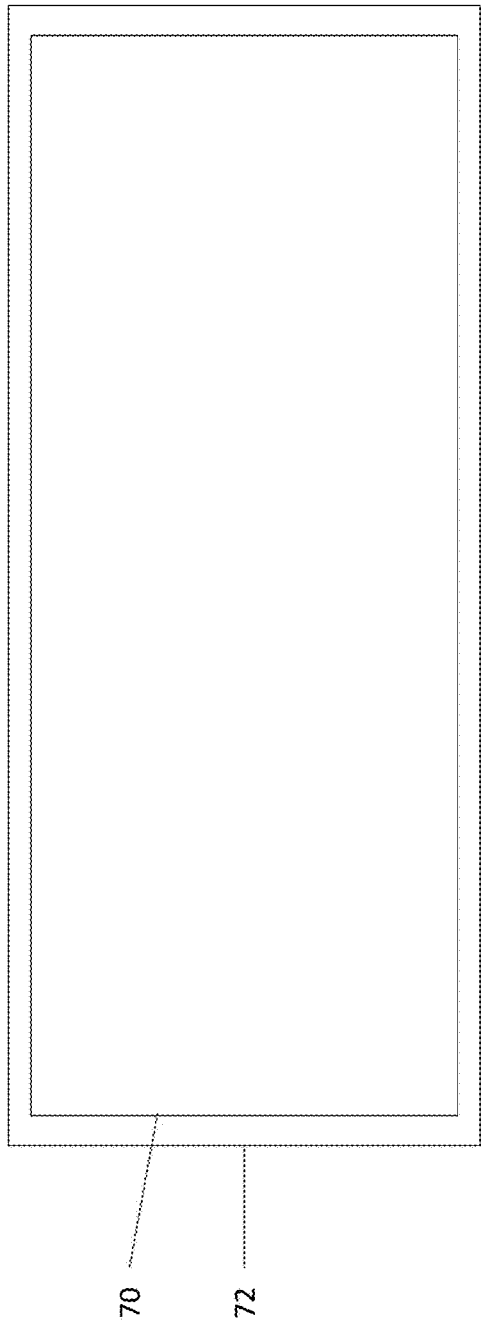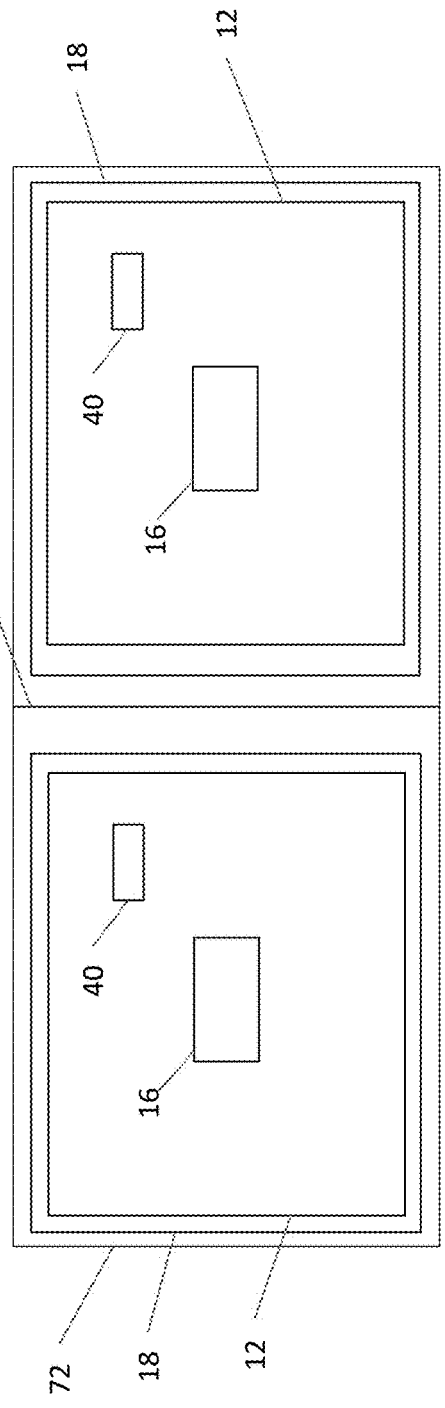

METHOD AND APPARATUS FOR UNPACKING SEMICONDUCTOR WAFER CONTAINER

RELATED APPLICATION

This application is a divisional of U.S. application Ser. No. 15/339,343, filed Oct. 31, 2016, now U.S. Pat. No. 10,840,121, the entire contents of which is incorporated herein by reference.

TECHNICAL FIELD

The disclosure relates to a semiconductor wafer manufacturing process and more particularly to semiconductor wafer container handling during the semiconductor manufacturing process.

BACKGROUND

It is desirable to handle and transport semiconductor wafer containers in a manner that ensures integrity of the semiconductor wafers and safety to the handlers. Manually handling semiconductor wafer containers may lead to semiconductor wafer breakage if the containers are not handled properly. The semiconductor wafer containers are tightly sealed in plastic bags when transported. When processing of the semiconductor wafers stored in the semiconductor wafer containers is necessary, the semiconductor wafer container needs to be removed from the plastic bag. To remove the semiconductor wafer container from the bag, the bag is cut open. Manually cutting the bags can result in damage to the wafers during the bag removal process and exposes the handler to sharp cutting tools. An automated semiconductor wafer container unpacking process and apparatus for performing semiconductor wafer container unpacking is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 14 depicts a semiconductor wafer container shipping box in a sealed bag.

FIG. 15 depicts semiconductor wafer containers in a semiconductor wafer container shipping box.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
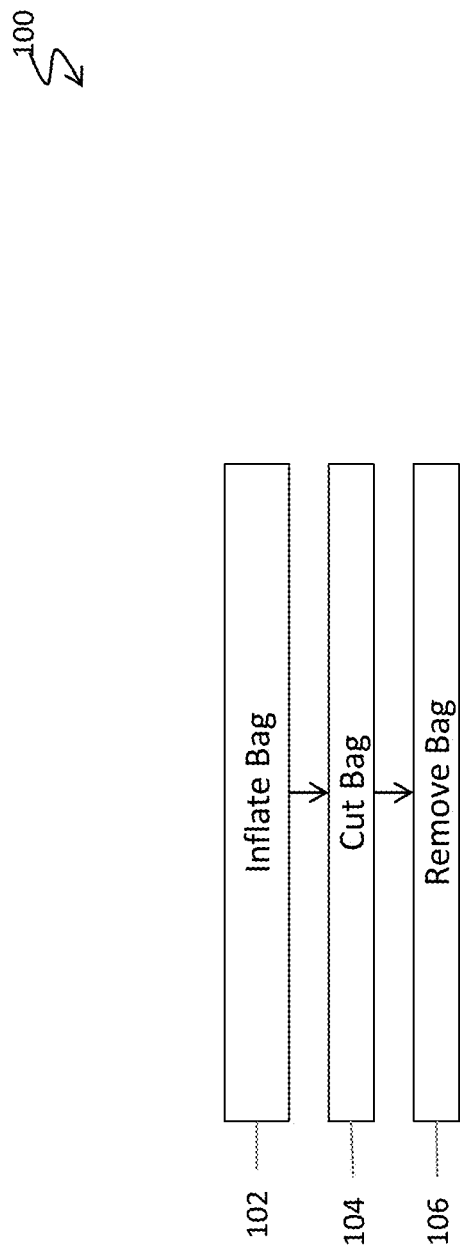
FIG. 1 depicts a method for unpacking a semiconductor wafer container from a sealed bag according to an embodiment of the present disclosure.

An automated method 100 of unpacking a container containing semiconductor wafers from a sealed bag, is illustrated in FIG. 1, according to an embodiment of the disclosure. The method includes an operation 102 of inflating the sealed bag with a gas using an automated gas dispenser. The semiconductor wafer container containing the semiconductor wafers is located in the sealed bag. After inflating the bag, the bag is subjected to a cutting operation 104 using an automated cutting device. An operation 106 of removing the cut bag from around the wafer container is subsequently performed.

Figure 2:
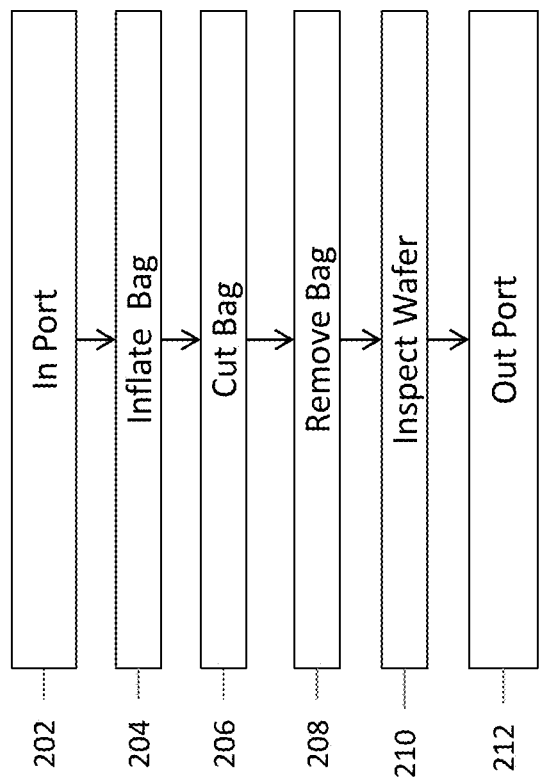
FIG. 2 depicts another method for unpacking a semiconductor wafer container from a sealed bag according to another embodiment of the present disclosure.
Figure 3:
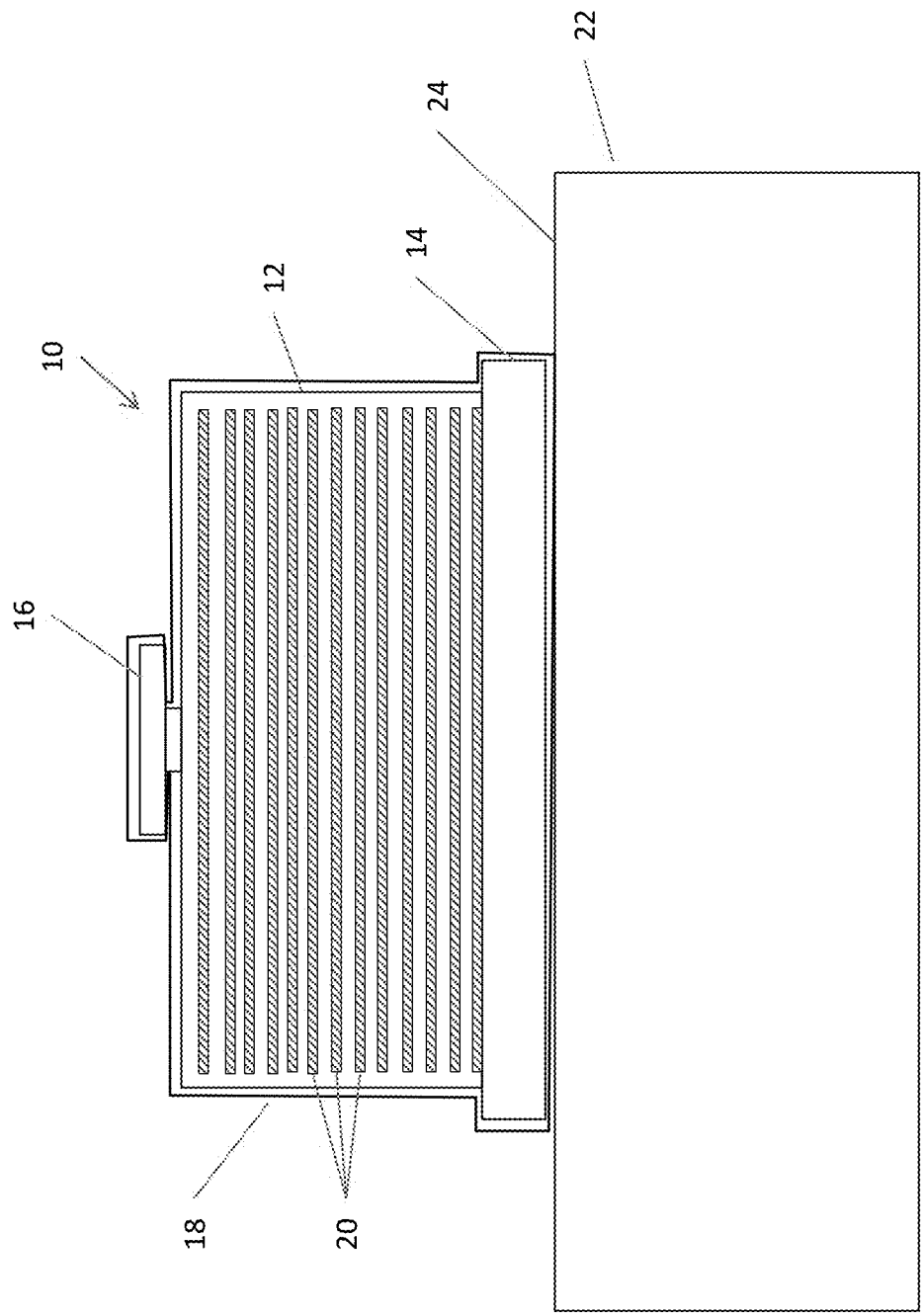
FIG. 3 is a side view depicting a step in a method for unpacking a semiconductor wafer container from a sealed bag according to an embodiment of the present disclosure.

An automated method 200 of unpacking a container containing semiconductor wafers from a sealed bag, is illustrated in FIG. 2, according to another embodiment of the disclosure. The method includes an operation 202 of introducing a semiconductor wafer container sealed in a bag into an in port of an unpacking apparatus. The sealed bag is inflated with a gas during a bag inflating operation 204 using an automated gas dispenser. After inflating the bag, the bag is subjected to a cutting operation 206 using an automated cutting device, and an operation 208 of removing the cut bag from around the semiconductor wafer container is subsequently performed. After removal of the cut bag, the semiconductor wafers inside the container are inspected during a semiconductor wafer inspection operation 210. After the semiconductor wafer inspection, an operation 212 of transferring the semiconductor wafer container to an out port of the semiconductor wafer container unpacking apparatus is performed.

Additional methods and apparatuses according to the present disclosure will be explained in reference to FIGS. 3 to 11. As shown in the side view of FIG. 3, a semiconductor wafer container 12 containing semiconductor wafers 20 is supported on a surface 24 of a platform 22 of a semiconductor wafer container unpacking apparatus 10. The semiconductor wafer container 12 is positioned in a desired orientation by the use of sensors (not shown) and a restraining mechanism (not shown) maintains the semiconductor wafer container 12 in the desired orientation during subsequent processing in some embodiments. The semiconductor wafer container 12 is sealed in a bag 18, such as an impermeable plastic bag. In some embodiments, the impermeable plastic bag is a polyethylene or a polyethylene terephthalate bag. The impermeable bag inhibits oxygen and water vapor transport across the bag to prevent degradation of the semiconductor wafers stored in the bag. In certain embodiments, the bag is an anti-static bag. The anti-static bag may be a polyethylene or a polyethylene terephthalate bag having a thin metal layer, such as an aluminized polyethylene or polyethylene terephthalate bag. A desiccant pack is included in the bag in some embodiments. In some embodiments, the bag is vacuum sealed. In other embodiments, an inert gas, such as nitrogen, is introduced into the bag prior to sealing.

In some embodiments, the semiconductor wafer container 12 is delivered to the unpacking apparatus 10 from a prior processing stage by a conveyor, including belts and rollers. In other embodiments, the semiconductor wafer container 12 is delivered to the unpacking apparatus 10 by an overhead track or by one or more robots.

The semiconductor wafer container 12 includes a base 14 and a plurality of supports along the internal sidewalls (not shown) to support the semiconductor wafers 20. In some embodiments, the semiconductor wafer container 12 contains from 1 to about 25 semiconductor wafers 20. In other embodiments, the semiconductor wafer container 12 contains from 15 to 25 semiconductor wafers 30. In some embodiments, the semiconductor wafers 20 are 200 mm diameter or 300 mm diameter semiconductor wafers. The semiconductor wafer container 12 may further include a flange 16 on the top surface of the semiconductor wafer container 12. The flange 16 is used to secure the semiconductor wafer container 12 during processing. In some embodiments, the semiconductor wafer container 12 is made of a transparent or translucent engineering plastic. In certain embodiments, the engineering plastic forming the semiconductor wafer container 12 is a polycarbonate or a polysulfone. In some embodiments, the semiconductor wafer container 12 is a front opening unified pod (FOUP) or a front opening shipping box (FOSB).

Figure 4:
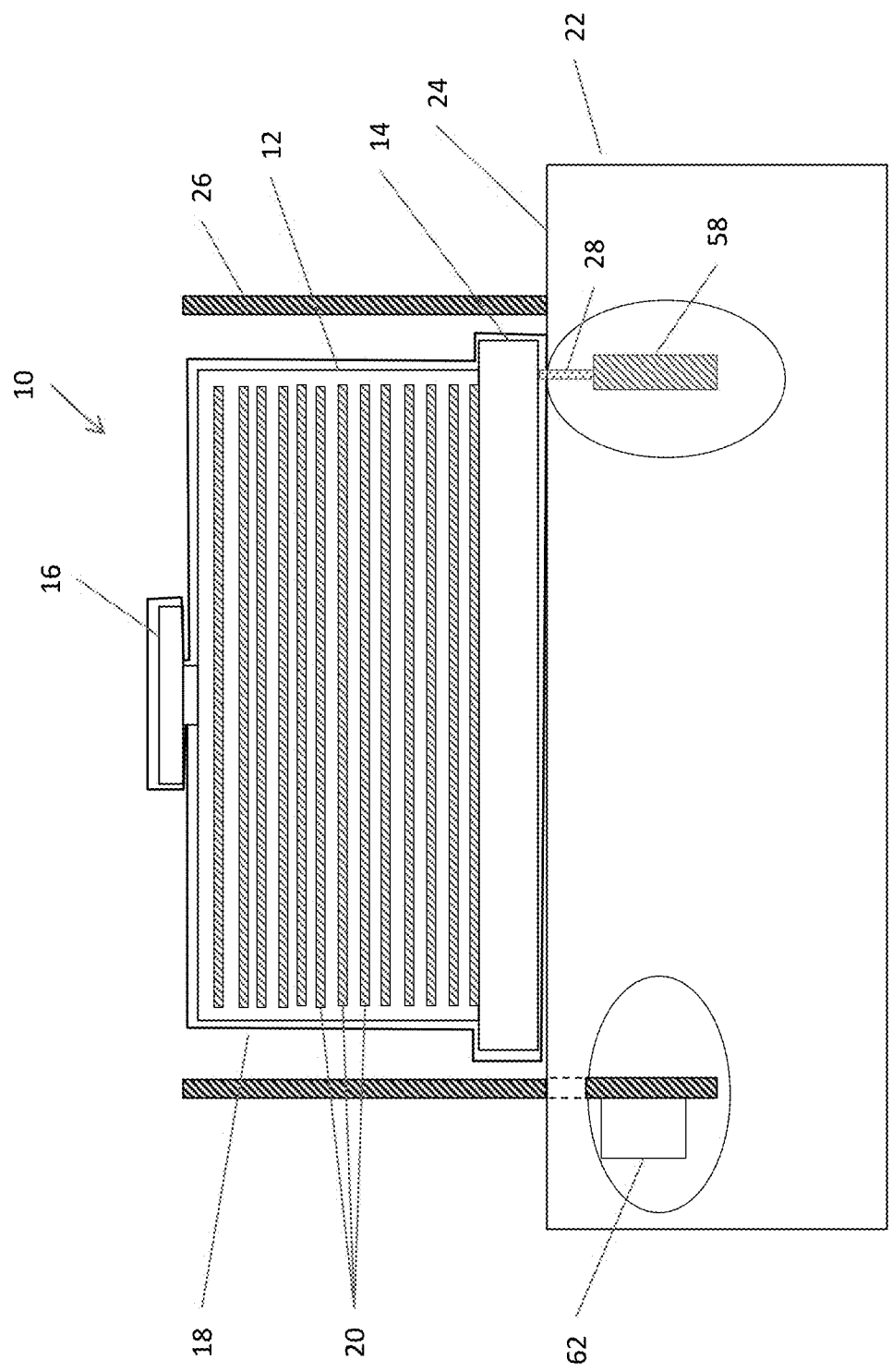
FIG. 4 is a side view depicting a step in a method for unpacking a semiconductor wafer container from a sealed bag according to an embodiment of the present disclosure.

Adverting to FIG. 4, a frame 26, including a plurality of members, rises from the platform 22. The frame 26 is attached to a slide unit 62 to control the up and down movement of the frame 26 in some embodiments. In some embodiments, the frame 26 is formed of a suitable metal, such as carbon steel, stainless steel, aluminum, or an engineering plastic. In this embodiment, the frame includes two members on opposing sides of the semiconductor wafer container 12.

In some embodiments, a nozzle 28 pierces the bag 18 enclosing the semiconductor wafer container 12. The nozzle 28 may include a sharp point to pierce the bag 18. In certain embodiments, the nozzle 28 is raised by a pneumatic cylinder 58 after the semiconductor wafer container 12 is properly positioned. A portion of the bottom of the base 14 of the semiconductor wafer container 12 is recessed in some embodiments, thus the nozzle 28 does not contact and damage the semiconductor wafer container 12. In other embodiments, the semiconductor wafer container 12 is positioned on the surface 24 of the platform 22 so that the nozzle 28 is aligned with one of a number of slots or recesses in the bottom of the base 14.

In some embodiments, the nozzle 28 is formed of a suitable metal, such as carbon steel, stainless steel, aluminum, or an engineering plastic. In some embodiments, two or more nozzles are used.

Figure 5:
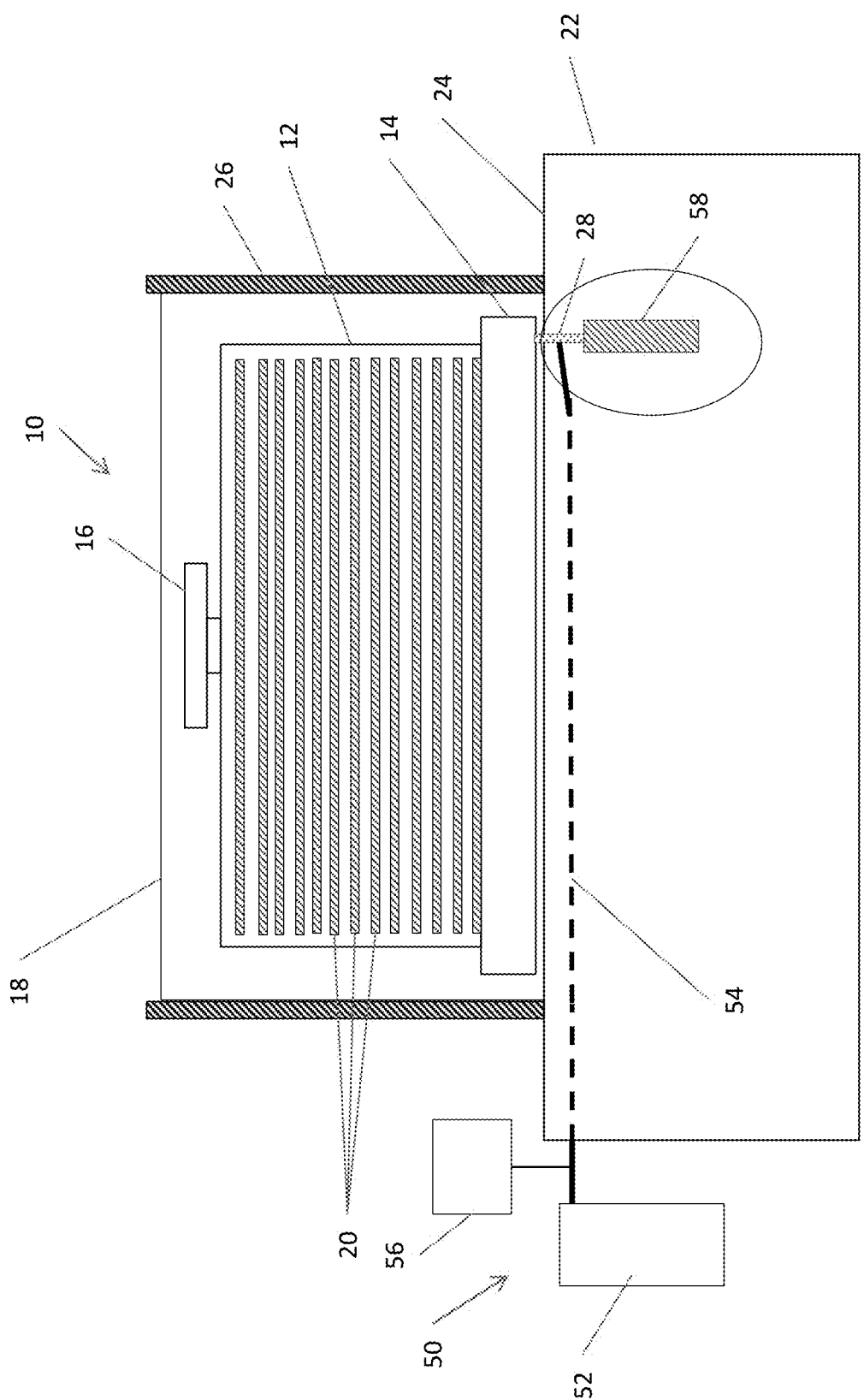
FIG. 5 is a side view depicting a step in a method for unpacking a semiconductor wafer container from a sealed bag according to an embodiment of the present disclosure.

As shown in FIG. 5, a gas is introduced through the nozzle 28 to inflate the bag 18. In some embodiments, 0.01 $m^3$ to 0.1 $m^3$ of the gas is added to the bag 18 while inflating the bag 18. In some embodiments, an automated gas dispenser 50 is used to supply the gas. The automated gas dispenser includes: a gas supply 52, tubing 54 to supply the gas, the nozzle 28, and a controller 56 for controlling the amount of gas dispensed to the bag 18. The gas is clean, dry air in some embodiments. In other embodiments, the gas is nitrogen or an inert gas, such as helium, argon, or neon. In some embodiments, the pressure inside the bag may be monitored by a pressure gauge. By the action of inflating the bag 18, the bag 18 separates from the semiconductor wafer container 12 forming a gap between the bag 18 and the semiconductor wafer container 12.

Figure 6:
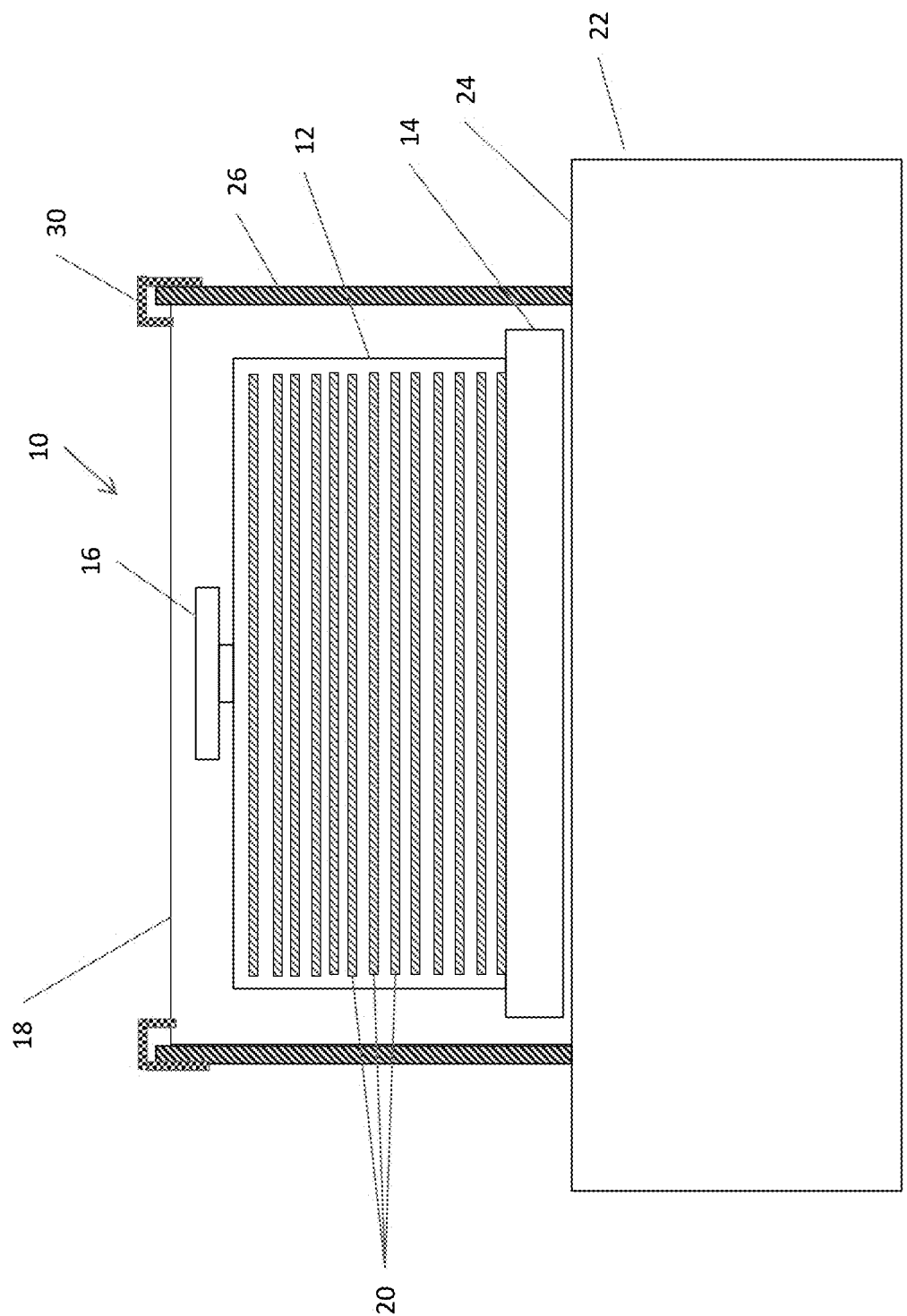
FIG. 6 is a side view depicting a step in a method for unpacking a semiconductor wafer container from a sealed bag according to an embodiment of the present disclosure.

As shown in FIG. 6, after inflating the bag, bag securing mechanisms 30 on the frame 26 holds the periphery of the upper surface of the bag 18, and pull the upper surface of the bag 18 taut in some embodiments. In some embodiments, the bag securing mechanism 30 is a claw that grabs the bag 18. In other embodiment, the bag securing mechanism 30 is a vacuum pad gripper that secures the bag 18 by the action of a vacuum.

Figure 7:
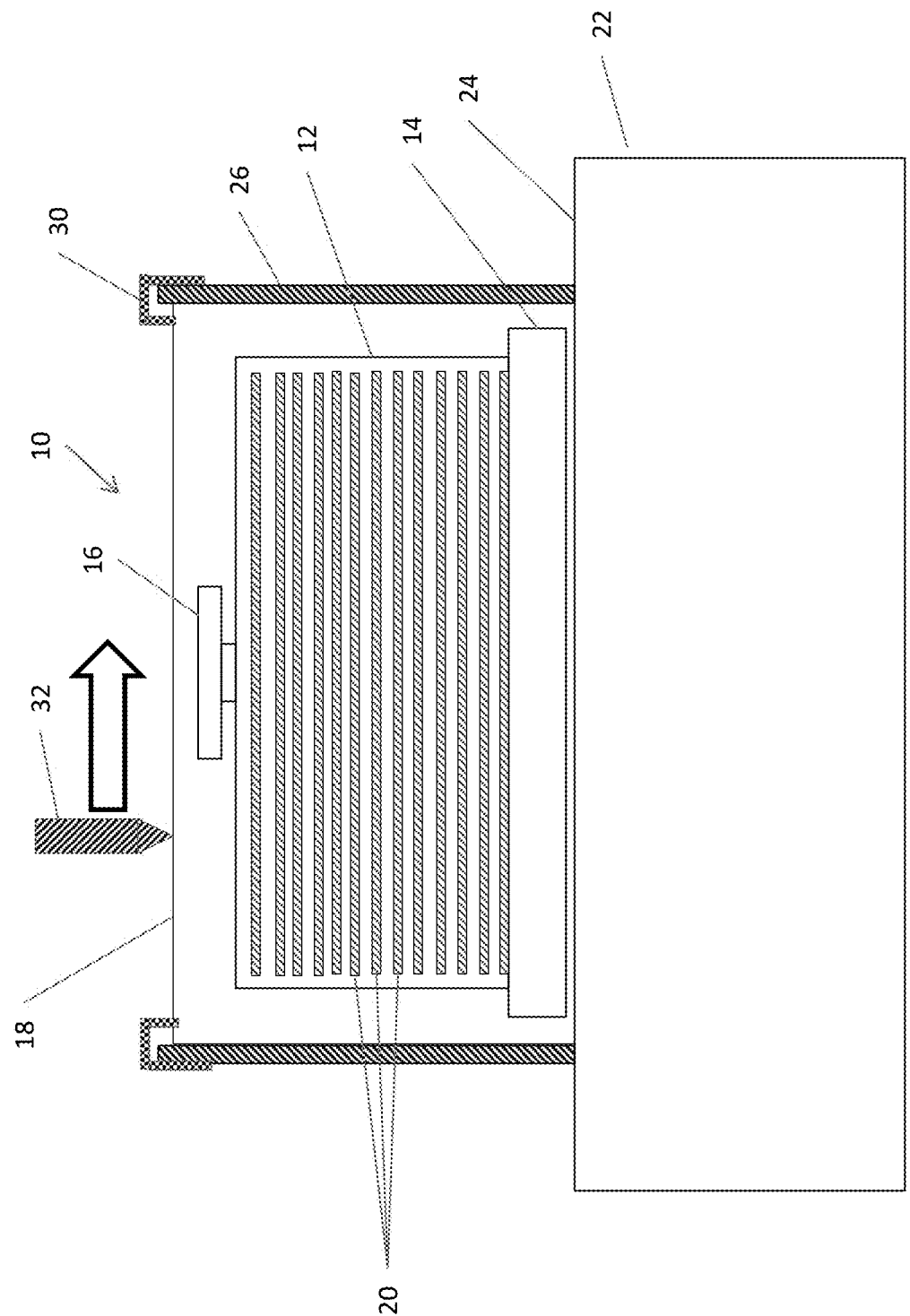
FIG. 7 is a side view depicting a step in a method for unpacking a semiconductor wafer container from a sealed bag according to an embodiment of the present disclosure.
Figure 8:
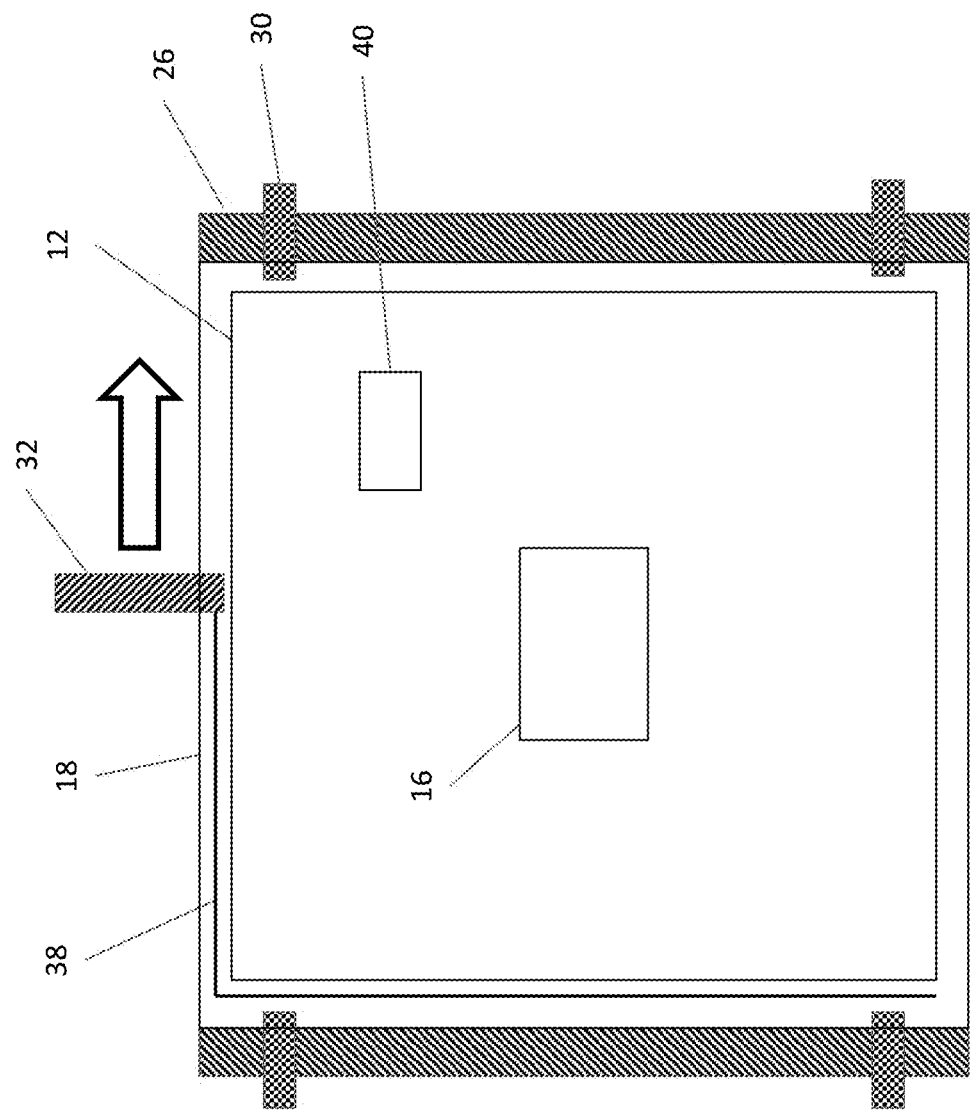
FIG. 8 is a top view depicting a step in a method for unpacking a semiconductor wafer container from a sealed bag according to an embodiment of the present disclosure.

A cutting device 32 is used to cut top surface of the bag 18, as shown in FIG. 7. The cutting device 32 can be a knife or a laser, or any other suitable cutting device for cutting through a plastic bag. In some embodiments, the cutting device 32 is attached to a robot arm controlled by a controller. In some embodiments, the cutting device 32 forms a cut 38 around the periphery of the bag 18 in the direction of the arrow, as shown in a top view of the cutting operation in FIG. 8. The cut 38 is formed at the gap between the wall of the inflated bag 18 and the semiconductor wafer container 12. By forming the cut 38 at the gap between the wall of the inflated bag 18 and the semiconductor wafer container 12, the cutting device 32 avoids contact with the semiconductor wafer container 12 during cutting, and thereby avoids damaging the semiconductor wafer container 12. In some embodiments, the cutting device 32 is a laser, including a $CO_2$ laser or a fiber laser. In some embodiments, the cut 38 is formed around an entire periphery of the bag 18. In other embodiments, the cut 38 is made around a sufficient portion of the periphery so that the bag 18 can be removed in a subsequent bag removal operation. In some embodiments, the semiconductor wafer container 12 is positioned on an X-Y table, and the X-Y table is moved relative to a stationary cutting device during the cutting operation. In some embodiments, a seal is not formed between the nozzle 28 and the bag 18 during bag inflation. Therefore, the bag cutting operation should be performed in a short time period, such as less than 20 seconds, in some embodiments.

The semiconductor wafer container 12 includes identifying information 40, such as a barcode or a radio frequency identification (RFID) tag. The identifying information 40 contains information about the lot of semiconductor wafers 20 stored in the semiconductor wafer container 12. The barcode can be scanned by a barcode reader or the RFID tag can be read by an RFID reader before and after the unpacking process, and the information read by the reader stored in a computer controlling the unpacking operation in some embodiments.

After the top surface of the bag 18 is cut, the cut top surface of the bag 18 can be removed by a robot, and the bag 18 is removed from around the semiconductor wafer container 12 in some embodiments. The robot can have a claw or a vacuum pad gripper to secure the top surface of the bag during removal. In certain embodiments, the top surface of the bag 18 is held by the robot during the cutting operation.

In some embodiments, other surfaces of the bag 18 are cut. For example, in a certain embodiment, a side of the bag 18 facing a front door of a FOUP is cut in addition to the top surface of the bag 18. In other embodiments, a side of the bag 18 facing any of the six major outer surfaces of the semiconductor wafer container 12 are cut during the cutting operation.

Figure 9:
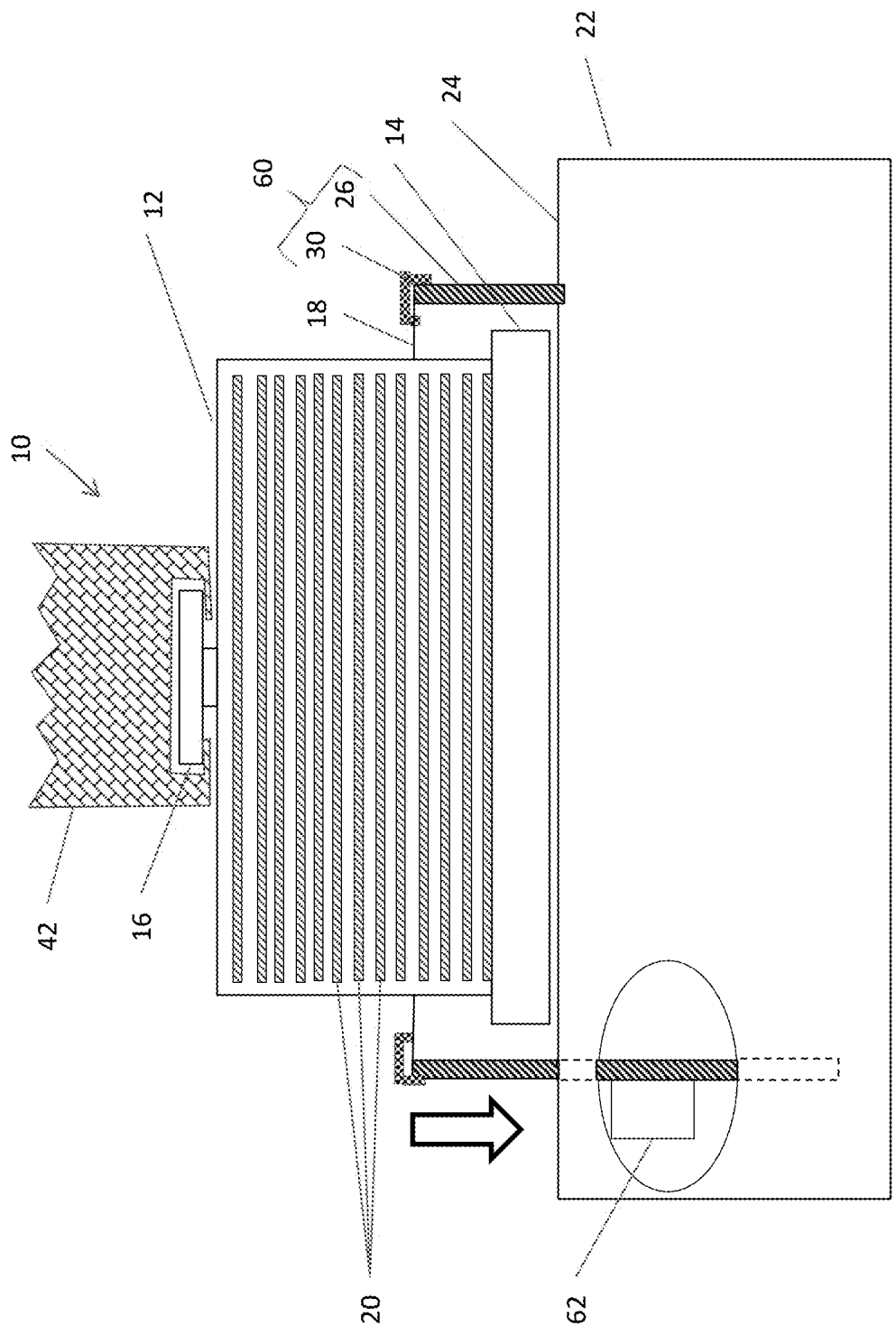
FIG. 9 is a side view depicting a step in a method for unpacking a semiconductor wafer container from a sealed bag according to an embodiment of the present disclosure.
Figure 10:
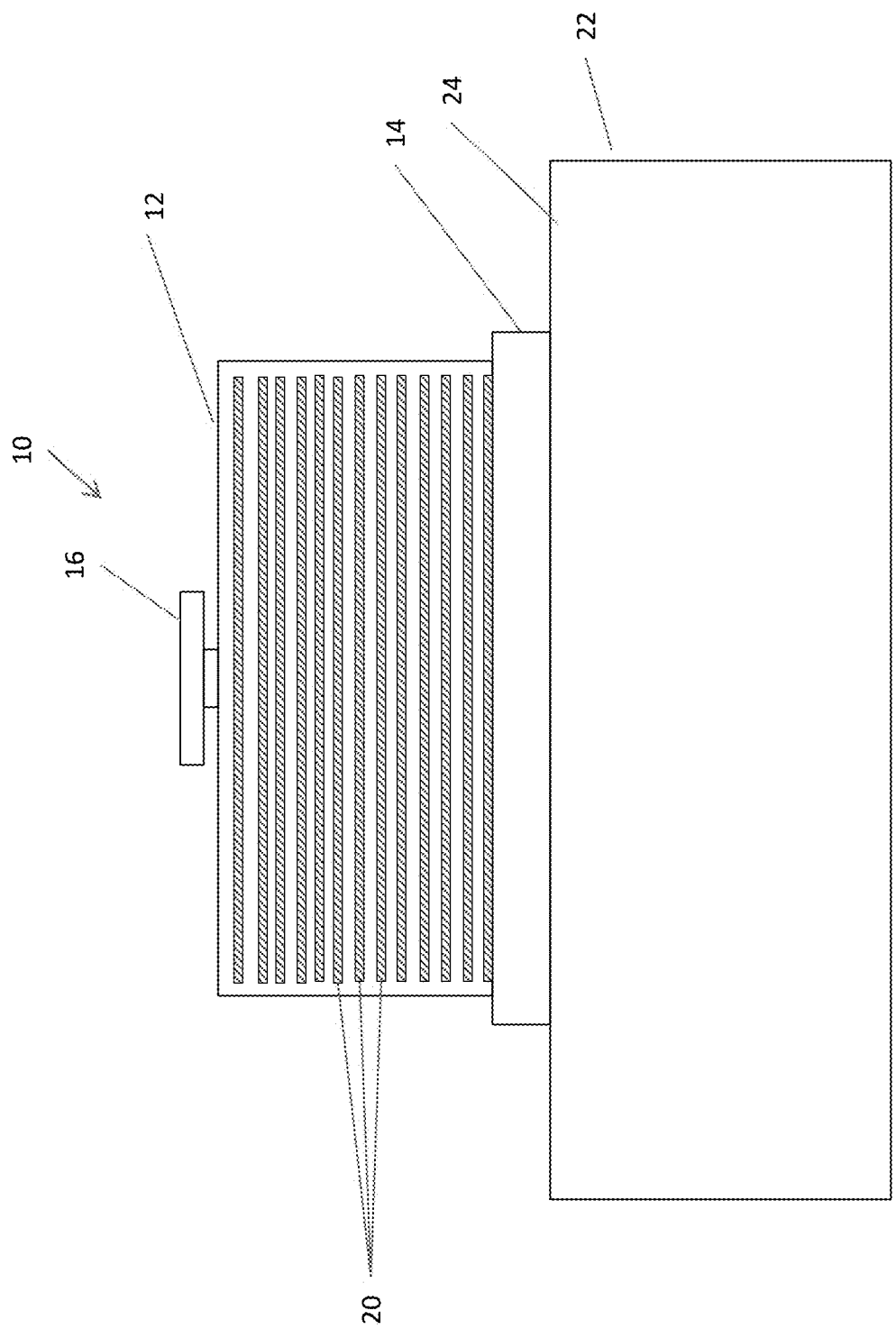
FIG. 10 is a side view depicting a step in a method for unpacking a semiconductor wafer container from a sealed bag according to an embodiment of the present disclosure.

After the cutting operation is completed, the gas supply is shut off, the nozzle 28 retracts, and the bag 18 is pulled down around the semiconductor wafer container by the action a bag removing mechanism 60 in some embodiments. The bag removing mechanism 60 includes the bag securing mechanism 30, the frame 26, and the slide unit 62. The bag securing mechanism 30 securing the bag 18 and the frame 26 retract down below the surface 24 of the platform 22 by the action of the slide unit 62 connected to the frame 26 in some embodiments, as shown in FIG. 9. In certain embodiments, the semiconductor wafer container 12 is held by a holding mechanism 42 during the bag removal. The holding mechanism 42 may secure the semiconductor wafer container 12 by engaging a flange 16 on the top of the semiconductor wafer container 12 after cutting the top surface of the bag 18 to expose the flange 16 in certain embodiments. The flange 16 may also be used to secure the semiconductor wafer container 12 to a semiconductor wafer container transport system such as an overhead track or a robot. After removal of the bag 18, the semiconductor wafer container 12 and the semiconductor wafers 20 therein are ready to undergo further processing, as shown in FIG. 10.

Figure 11:
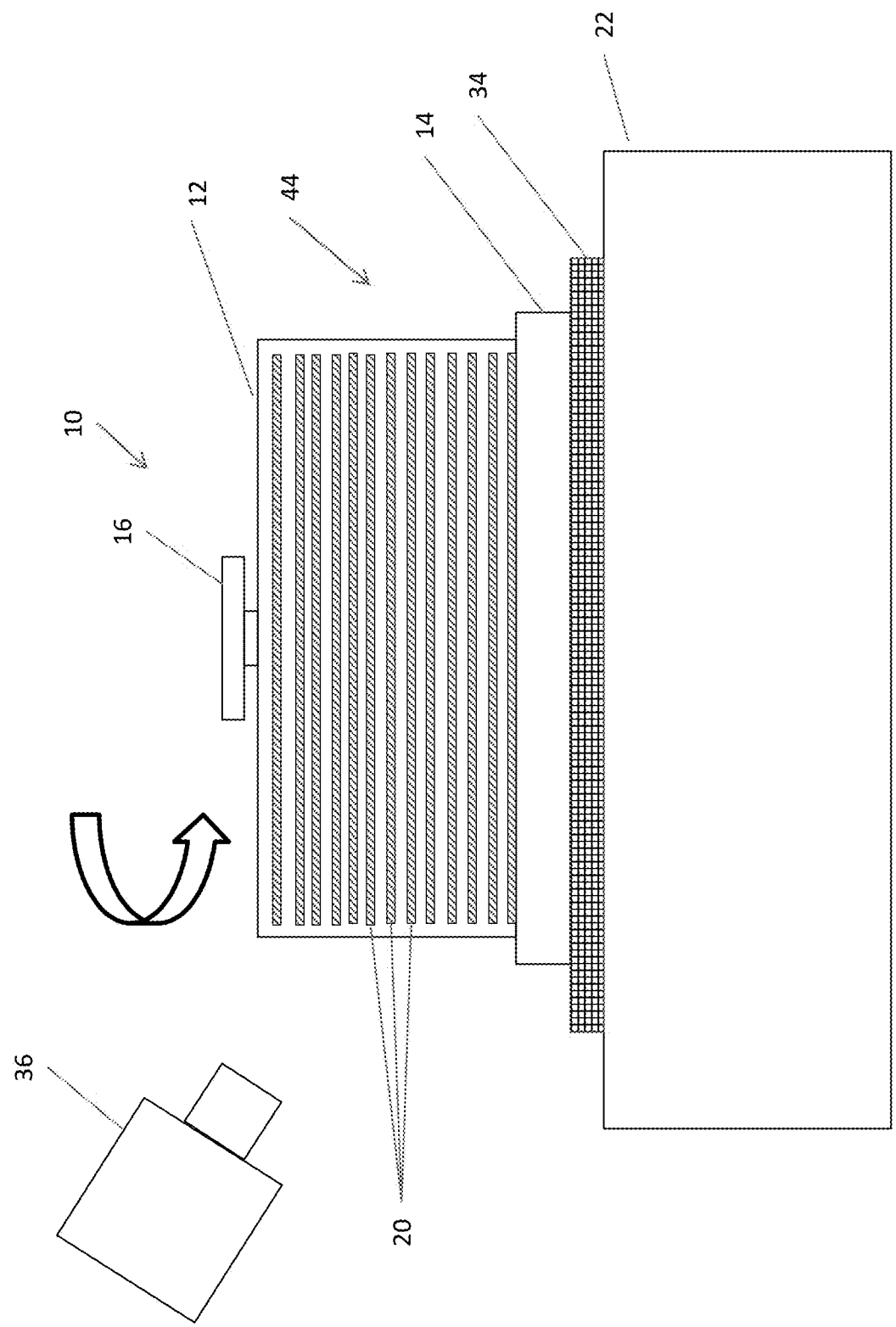
FIG. 11 is a side view depicting a step in a method for unpacking a semiconductor wafer container from a sealed bag according to an embodiment of the present disclosure.

In certain embodiments, after the bag is removed the semiconductor wafer container 12 is transported to an inspection stage. As shown in FIG. 11, the semiconductor wafer container 12 is transported to an inspection stage 44 of a semiconductor wafer containing unpacking apparatus 10. The semiconductor wafer container 12 may undergo optical inspection at the inspection stage 44. For example, in some embodiments, the semiconductor wafer container 12 is placed on a turntable 34 on a platform 22 and rotated while a camera 36 optically inspects the semiconductor wafers 20 looking for defects. The defects may include breaks and chips along the wafer 20 edges. The results of the inspection are input to a data file associated with the particular semiconductor wafer container 12. If defects are discovered, the data file is flagged and a semiconductor wafer unpacking apparatus operator is notified.

Figure 12:
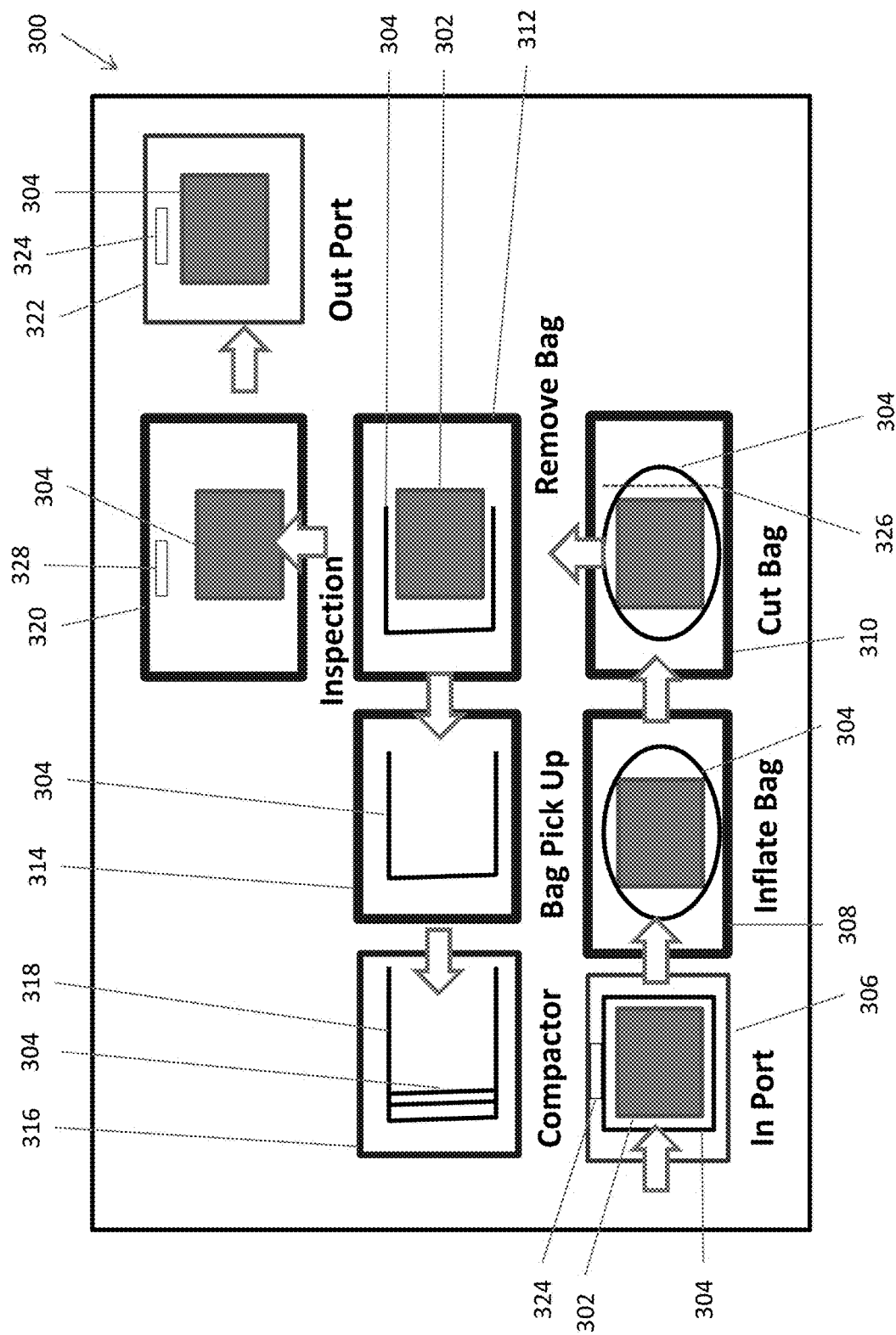
FIG. 12 depicts a sequential method and apparatus for unpacking a semiconductor wafer container from a sealed bag according to an embodiment of the present disclosure.

A method and an apparatus according to another embodiment of the present disclosure is explained in reference to FIG. 12. An apparatus for unpacking a semiconductor wafer container 300 is illustrated. A semiconductor wafer container 302 containing semiconductor wafers sealed in a bag 304 is transported to an in port stage 306 where identifying information about the semiconductor wafer container 302 and its contents are read by an information reader 324. The identifying information may be in any suitable form, such as a barcode attached to the semiconductor wafer container 302 or an RFID tag attached to or inside the semiconductor wafer container 302. The information reader 324 may be a barcode reader, an RFID tag scanner, or any other suitable device as necessary to read the identifying information about the semiconductor wafer container 302 and the semiconductor wafers contained therein. In certain embodiments, the in port stage 306 includes a semiconductor wafer container mechanism (not shown), to properly position the semiconductor wafer container 302 for subsequent processing operations.

In some embodiments, the semiconductor wafer container 302 contains from 1 to about 25 semiconductor wafers. In certain embodiments, the semiconductor wafer container 302 contains 15 to 25 semiconductor wafers. In some embodiments, the semiconductor wafers contained in the semiconductor wafer container 302 are 200 mm diameter or 300 mm diameter semiconductor wafers.

In some embodiments, the semiconductor wafer container 302 is a front opening unified pod (FOUP) or a front opening shipping box (FOSB). In some embodiments, the semiconductor wafer container 302 is made of a transparent or translucent engineering plastic. In certain embodiments, the engineering plastic forming the semiconductor wafer container 302 is a polycarbonate or a polysulfone. In some embodiments, the bag 304 is an impermeable transparent or translucent plastic bag. In some embodiments, the impermeable plastic bag 304 is a polyethylene or a polyethylene terephthalate bag. In certain embodiments, the plastic bag 304 is an anti-static bag. The plastic anti-static bag 304 may be a polyethylene or a polyethylene terephthalate bag having a thin metal layer, such as an aluminized polyethylene or polyethylene terephthalate bag. A desiccant pack is included in the bag 304 in some embodiments.

The bag may be evacuated and heat sealed after the semiconductor wafer container is placed inside the bag. In certain embodiments, the bag 304 is formed of a shrink wrap material, which conforms to the semiconductor wafer container upon shrinking after the semiconductor wafer is placed inside the bag.

After the in port stage 306, the next stage is a bag inflating stage 308. The bag 304 is inflated by injecting a gas through one or more nozzles (not shown). In some embodiments, 0.01 $m^3$ to 0.1 $m^3$ of the gas is added to the bag 304 while inflating the bag 304. The gas is clean, dry air in some embodiments. In other embodiments, the gas is nitrogen or an inert gas, such as helium, argon, or neon. In certain embodiments, the gas pressure in the bag 304 is monitored by a pressure gauge. By the action of inflating the bag 304, the bag 304 separates from the semiconductor wafer container 302 forming a gap between the bag 304 and the semiconductor wafer container 302.

Following the bag inflating stage 308, is a bag cutting stage 310. In the bag cutting stage 310, a cut 326 is made around a periphery of the bag 304 using a cutting device, such as a knife or a laser, or any other suitable device for cutting through a plastic bag. In some embodiments, the cut 326 is formed at the gap between the wall of the inflated bag 304 and the semiconductor wafer container 302. By forming the cut 326 at the gap between the wall of the inflated bag 304 and the semiconductor wafer container 302, the cutting device avoids contact with the semiconductor wafer container 302 during cutting, and thereby avoids damaging the semiconductor wafer container 302. In some embodiments, the cutting device is attached to a robot controlled by a controller programmed to carry out the cutting operation. In other embodiments, the semiconductor wafer container 302 is placed on an X-Y table, and the X-Y table is moved relative to a stationary cutting device during the cutting operation.

After the bag 304 is cut, the bag 304 is removed from around the semiconductor wafer container 302 at a bag removal stage 312. The bag can be removed by a bag securing mechanism attached to a slide unit, which secures the bag and pulls the cut bag away from the semiconductor wafer container. In some embodiments, the bag securing mechanism is a claw, which grasps the bag. In other embodiments, the bag securing mechanism is a vacuum pad gripper. In some embodiments, the cut bag is picked up at a bag pick up stage 314 by a robot controlled by a controller programmed to carry out the bag pick up. In certain embodiments, the robot has claws or to grab the bag. In other embodiments, the robot grasps and transports the bag using a vacuum.

The cut bags 304 are subsequently transported to a compactor stage 316 including a trash compactor 318 using a slide unit or a robot in certain embodiments, where the bags 304 are subsequently compacted for recycling or disposal. In certain embodiments, the compactor stage 316 includes a sensor for sensing when the trash compactor 318 is full. Meanwhile, the semiconductor wafer container 302 is transported to an inspection stage 320 where the semiconductor wafer container 302 and the semiconductor wafers contained therein undergo inspection. In the illustrated embodiment, the semiconductor wafer container 302 and semiconductor wafers contained therein undergo an optical inspection using a camera 328. The camera 328 looks for any visual defects in the semiconductor wafers. The defects may include breaks and chips along the wafer edges. The inspection data recorded by the camera 328 is stored in a computer configured to analyze the optical data and determine whether any of the semiconductor wafers are defective in some embodiments. The results of the semiconductor wafer inspection are input to a data file associated with the particular semiconductor wafer container 302 identified in the in port stage 306. If one or more defects in the semiconductor wafers is found, the data file is flagged with an appropriate warning and a semiconductor wafer unpacking apparatus operator is notified of the one or more defects, in certain embodiments.

When the trash compactor 318 is full, an alarm is generated to notify the semiconductor wafer container unpacking apparatus operator that the trash compactor 318 needs to be emptied, in some embodiments. In other embodiments, the trash compactor 318 is emptied automatically when the sensor senses the trash compactor 318 is full.

In certain embodiments, the final stage of the unpacking apparatus 300 is the out port stage 322 after the inspection stage 320. In the out port stage, the identifying information of the semiconductor wafer container is read by an information reader 324, such as a barcode reader or an RFID tag scanner, as necessary to read the identifying information about the semiconductor wafer container 302 and the semiconductor wafers contained therein. The semiconductor wafer container 302 is then routed to a subsequent processing stage or processing operation. The semiconductor wafer container 302 can be transported by robot, overhead track, conveyor belt, or any other suitable transport mechanisms.

Figure 13:
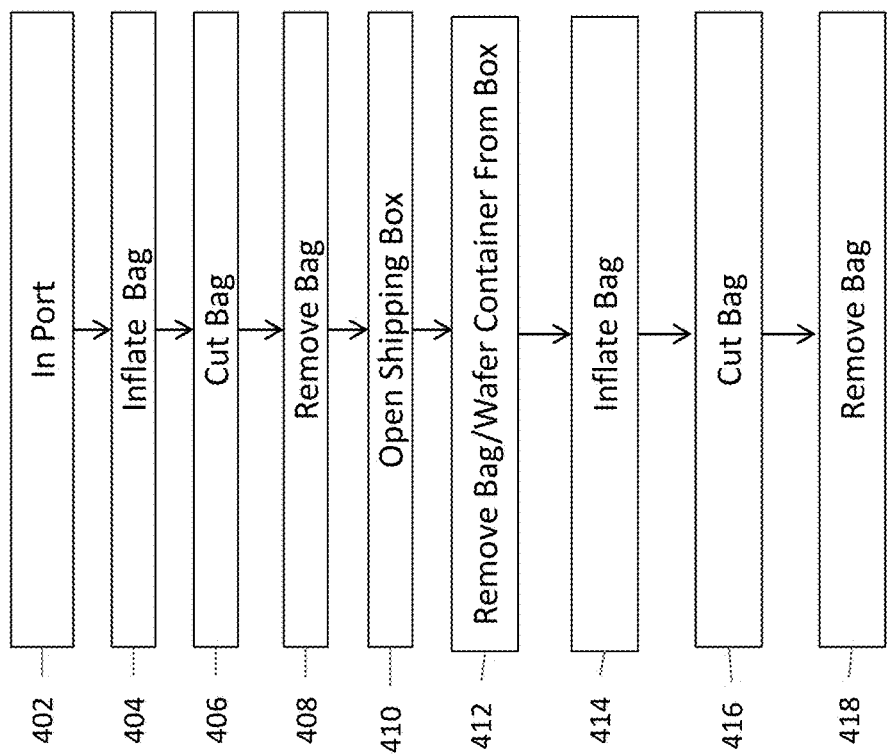
FIG. 13 depicts a method for unpacking a semiconductor wafer container shipping box from a sealed bag and unpacking a semiconductor wafer container from a sealed bag according to an embodiment of the present disclosure.

In another embodiment of the disclosure, an automated method 400 of unpacking a semiconductor wafer container shipping box from a sealed bag and unpacking a semiconductor wafer container from a sealed bag, is illustrated in FIG. 13. The method includes an operation 402 of introducing a semiconductor wafer container shipping box sealed in a bag containing a semiconductor wafer container sealed in a bag into an in port of an unpacking apparatus. The sealed bag is inflated with a gas during a bag inflating operation 404 using an automated gas dispenser. After inflating the bag, the bag is subjected to a cutting operation 406 using an automated cutting device, and an operation 408 of removing the cut bag from around the semiconductor wafer container shipping box is subsequently performed. After removal of the cut bag, an operation 410 of opening the shipping box is performed. An operation 412 of removing the semiconductor wafer container sealed in a bag from the semiconductor wafer container shipping box is subsequently performed. The sealed bag containing the semiconductor wafer container is inflated with a gas during a bag inflating operation 414 using an automated gas dispenser. After inflating the bag, the bag is subjected to a cutting operation 416 using an automated cutting device, and an operation 418 of removing the cut bag from around the semiconductor wafer container is subsequently performed.

FIG. 14 depicts a semiconductor wafer container shipping box 70 in a sealed bag 72. The shipping box 70 can be formed of any suitable material, such as cardboard. The semiconductor wafer container shipping box is sealed in a bag 72, such as an impermeable plastic bag, as previously described herein. The sealed bag 72 is removed from the around the shipping box 70 in the same manner as the sealed bag 18 is removed from semiconductor wafer container 12 previously described herein. In certain embodiments, the same unpacking apparatus 10 is used to remove both the sealed bag 72 from around the shipping box 70 and to remove the sealed bag 18 from around the semiconductor wafer container 12.

FIG. 15 depicts a plan view of semiconductor wafer containers 12 in a semiconductor wafer container shipping box 72. The individual semiconductor wafer containers 12 are sealed in bags 18. A divider 74 separates adjacent semiconductor wafer containers 12. In some embodiments, packing material surrounds the semiconductor wafer containers 12 to cushion the containers 12 and protect the containers 12 from damage from handling during transit. After removing the sealed semiconductor wafer containers 12 from the shipping box 72, the semiconductor wafer containers 12 are unpacked from the sealed bags 18, as previously described herein.

Improved wafer yield is achieved by unpacking wafer containers from sealed bags using an automated unpacking method and apparatus according to embodiments of the present disclosure. Improved wafer yield is also achieved by unpacking wafer container shipping boxes from sealed bags using an automated unpacking method and apparatus according to embodiments of the present disclosure. By eliminating manual handling of the wafer container shipping boxes and wafer containers during unpacking the possibility of dropping the shipping box or wafer container and breaking wafers is reduced. Also, the contacting of the semiconductor wafer container by sealed bag cutting devices is prevented, thereby preventing damage to the semiconductor wafer container by the cutting devices. Further, the safety of the operators is improved, as operator manual handling of sharp tools for cutting the sealed bag to remove the shipping box or wafer container is eliminated. In addition, efficiency is improved during wafer processing as operator positions are eliminated by the automated unpacking of the shipping box and wafer container.

In an embodiment of the present disclosure, an automated method of unpacking a container containing semiconductor wafers from a sealed bag is provided. The method includes inflating the bag with a gas using an automated gas dispenser. After inflating the bag, the bag is cut using an automated cutting device to expose the container, and the cut bag is removed from around the container.

In another embodiment of the present disclosure, an apparatus for unpacking a container containing semiconductor wafers from a sealed bag is provided. The apparatus includes a platform for supporting the container and a nozzle for inserting gas into the sealed bag. A cutting device cuts the sealed bag, and a bag removing mechanism removes the bag.

In another embodiment of the present disclosure, an apparatus for unpacking a container from a sealed bag is provided. The container is a front opening unified pod or a front opening shipping box containing 200 mm or 300 mm semiconductor wafers. The apparatus includes a platform for supporting the container and a nozzle for inserting gas into the sealed bag. A cutting device cuts the sealed bag and a bag removing mechanism removes the bag. An inspection stage inspects the wafers in the container, and a compactor compacts the bag removed from the container.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for unpacking a container containing semiconductor wafers from a sealed bag, comprising:
    a platform for supporting the container;
    a nozzle for inserting gas into the sealed bag;
    a cutting device for cutting the sealed bag,
    wherein the cutting device is a laser; and
    a bag removing mechanism for removing the bag.

2. The apparatus of claim 1, wherein the container is a front opening unified pod or front opening shipping box containing 200 mm or 300 mm semiconductor wafers.

3. The apparatus of claim 1, further comprising a data reader for identifying information corresponding to the container and/or the wafers, and the container includes the identifying information.

4. The apparatus of claim 1, further comprising a compactor for compacting the bag removed from the container.

5. The apparatus of claim 1, further comprising an inspection stage for inspecting the wafers in the container.

6. The apparatus of claim 5, wherein the inspection stage includes a camera.

7. The apparatus of claim 5, wherein the inspection stage includes a turntable to rotate the container during the inspecting the wafers.

8. The apparatus of claim 1, wherein the apparatus includes a holding mechanism for holding the container while the bag is removed.

9. An apparatus for unpacking a container from a sealed bag, wherein the container is a front opening unified pod or a front opening shipping box containing 200 mm or 300 mm semiconductor wafers, comprising:
    a platform for supporting the container;
    a nozzle for inserting gas into the sealed bag;
    a cutting device for cutting the sealed bag;
    a bag removing mechanism for removing the bag;
    an inspection stage for inspecting the wafers in the container;
    a compactor for compacting the bag removed from the container;
    an information reader configured to read information about wafers stored in the container; and
    a computer configured to control the unpacking and to store the information about wafers stored in the container.

10. The apparatus of claim 9, wherein the inspection stage includes a camera.

11. The apparatus of claim 9, wherein the inspection stage includes a turntable to rotate the container during the inspecting the wafers.

12. The apparatus of claim 9, wherein the apparatus includes a holding mechanism for holding the container while the bag is removed.

13. The apparatus of claim 9, wherein the cutting device is a laser or a knife.

14. An apparatus for unpacking a container containing semiconductor wafers from a sealed bag, comprising:
    a platform for supporting the container;
    a nozzle for inserting gas into the sealed bag;
    a cutting device for cutting the sealed bag; and
    a bag removing mechanism for removing the bag,
    wherein the bag removing mechanism comprises:
        a frame;
        a bag securing mechanism attached to the frame; and
        a slide unit attached to the frame,
        wherein the bag securing mechanism and frame are configured to retract below a surface of the platform by an action of the slide unit.

15. The apparatus of claim 14, wherein the container is a front opening unified pod or front opening shipping box containing 200 mm or 300 mm semiconductor wafers.

16. The apparatus of claim 14, further comprising a data reader for identifying information corresponding to the container and/or the wafers, and the container includes the identifying information.

17. The apparatus of claim 14, further comprising a compactor for compacting the bag removed from the container.

18. The apparatus of claim 14, further comprising an inspection stage for inspecting the wafers in the container.

19. The apparatus of claim 18, wherein the inspection stage includes a camera.

20. The apparatus of claim 18, wherein the inspection stage includes a turntable to rotate the container during the inspecting the wafers.

\* \* \* \* \*